United States Patent [19]

Okada

[11] Patent Number: 4,882,839

[45] Date of Patent: Nov. 28, 1989

[54] METHOD OF MANUFACTURING MULTI-LAYERED WIRING SUBSTRATE

[75] Inventor: Yoshitsugu Okada, Tokyo, Japan

[73] Assignee: NEC Corporation, Tokyo, Japan

[21] Appl. No.: 339,718

[22] Filed: Apr. 18, 1989

[30] Foreign Application Priority Data

Apr. 22, 1988 [JP] Japan .................... 63-100833

[51] Int. Cl.⁴ .................... H05K 3/06; H05K 3/28; H05K 3/46
[52] U.S. Cl. .................... 29/853; 29/852; 29/846; 156/644; 156/656; 156/659.1; 156/661.1; 156/901; 156/902; 427/96; 427/97; 427/125; 427/259; 427/264; 427/265; 427/331; 427/404; 174/68.5
[58] Field of Search .................... 29/846, 852, 853; 156/644, 656, 659.1, 661.1, 901, 902; 427/96, 97, 125, 259, 264, 265, 331, 404; 174/68.5; 204/192.15, 192.17

[56] References Cited

U.S. PATENT DOCUMENTS

| | | | |
|---|---|---|---|
| 4,360,570 | 11/1982 | Andreades et al. | |
| 4,381,327 | 4/1983 | Briere | |
| 4,526,859 | 7/1985 | Christensen et al. | 427/259 X |
| 4,569,876 | 2/1986 | Nakakita | |
| 4,693,925 | 9/1987 | Cheung et al. | 427/96 X |
| 4,708,904 | 11/1987 | Shimizu et al. | 427/96 X |
| 4,752,555 | 6/1988 | Takada et al. | 427/96 X |
| 4,757,033 | 7/1988 | Ebata | 156/644 X |
| 4,780,957 | 11/1988 | Shiga et al. | 29/852 X |
| 4,801,469 | 1/1989 | Norwood | 427/125 X |
| 4,806,188 | 2/1989 | Rellick | 29/852 X |
| 4,818,335 | 4/1989 | Karnett | 156/644 |
| 4,824,716 | 4/1989 | Yerman | 427/96 X |

FOREIGN PATENT DOCUMENTS

| | | | |
|---|---|---|---|
| 1191592 | 4/1965 | Fed. Rep. of Germany | 427/259 |
| 2420859 | 11/1974 | Fed. Rep. of Germany | 427/96 |
| 3639604 | 5/1988 | Fed. Rep. of Germany | 427/96 |
| 18169 | 2/1977 | Japan | 427/96 |
| 1565 | 1/1981 | Japan | 427/96 |

OTHER PUBLICATIONS

"Mechanically Bonded Circuit", Haddad et al., IBM Technical Disclosure Bulletin, vol. 2, No. 1, 6/1959.
"Molded Printed Circuit", Kollmeier et al., IBM Technical Disclosure Bulletin, vol. 9, No. 11, 4/1967.
"Depositing Adhesion Layers for Contact Between Noble Metals and Dielectric Material", Romankiw, IBM Technical Disclosure Bulletin, vol. 18, No. 5, 10/1975.
"MCP via Configurations", IBM Technical Disclosure Bulletin, vol. 24, No. 5, (Oct. 1918), pp. 2575-2576, Abolafia et al.
"Controlled Diffusion Bonding in Multilevel Package", IBM Technical Disclosure Bulletin, vol. 24, No. 12, (May 1982), pp. 6364-6365, D. Clocher et al.
"High Reliability Metallurgical Structure for Multilevel Substrate Wiring", IBM Technical Disclosure Bulletin, vol. 24, No. 12, (May 1982), p. 6370, W. B. Archey et al.

Primary Examiner—Timothy V. Eley
Assistant Examiner—Peter D. Vo
Attorney, Agent, or Firm—Burns, Doane, Swecker & Mathis

[57] ABSTRACT

According to a method of manufacturing a multi-layered wiring substrate, a palladium thin film is formed on an entire surface of a substrate including a conductor wiring layer. A portion except for a predetermined via formation portion on the palladium thin film is masked by a first photoresist. A polyimide-based conductive resin is embedded in the via formation portion through the first photoresist. The first photoresist is removed. The conductor wiring layer and the via formation portion are masked by a second photoresist. The exposed palladium thin film is etched. The second photoresist is removed. The conductive resin is cured. A photosensitive polyimide resin is applied to an entire surface of the substrate, a via-hole is formed in the via formation portion, and the photosensitive polyimide resin is cured.

1 Claim, 3 Drawing Sheets

METHOD OF MANUFACTURING MULTI-LAYERED WIRING SUBSTRATE

BACKGROUND OF THE INVENTION

The present invention relates to a method of manufacturing a multi-layered wiring substrate having vias for electrically connecting upper and lower conductor wiring layers which sandwich a dielectric film.

In a conventional multi-layered wiring substrate using an organic dielectric film, vias for electrically connecting upper and lower conductor wiring layers which sandwich a dielectric film are formed by the following method. That is, after a photosensitive polyimide resin is applied to an entire surface of a substrate including a conductor wiring layer, exposure and development are performed through a predetermined mask to form via-holes. Then, after the photosensitive polyimide resin is cured, a polyimide-based conductive resin is embedded in the via-holes. The polyimide-based conductive resin is cured to form vias.

As described above, in a via formation means by the method of manufacturing a conventional multi-layered wiring substrate, first, a dielectric film having via-holes must be formed. However, it is considerably difficult to uniformly form these via-holes in an entire surface of the substrate. In particular, when the thickness of the dielectric film is increased, it is difficult to control the shapes of the via-holes. The formation state of the via-holes is insufficient, or the dielectric film is largely removed to form a reverse-tapered via-holes. In all cases, disconnection of the conductor wiring (pattern) in via portions is caused. When the thickness of the dielectric film is small, the via-hole shapes are easily controlled, and uniformity of the via-hole shapes in a single substrate is improved. However, reliable insulation between lower and upper conductor wiring layers cannot be achieved. In order to insulate the layers without failure, the thickness of the dielectric film need be increased. Thus, the method of manufacturing the conventional multi-layered wiring substrate has a drawback that it is difficult to obtain fine shapes of the via-holes in a dielectric film having a predetermined thickness.

SUMMARY OF THE INVENTION

It is an object of the present invention to provide a method of manufacturing a multi-layered wiring substrate, which can obtain via-holes each having a fine shape.

It is another object of the present invention to provide a method of manufacturing a multi-layered wiring substrate, which can achieve a reliable multi-layered wiring.

In order to achieve the above objects of the present invention, there is provided a method of manufacturing a multi-layered wiring substrate, comprising the first step of forming a palladium thin film on an entire surface of a substrate including a conductor wiring layer, the second step of masking a portion except for a predetermined via formation portion on the palladium thin film by a first photoresist, the third step of embedding a polyimide-based conductive resin in the via formation portion through the first photoresist, the fourth step of removing the first photoresist, the fifth step of masking the conductor wiring layer and the via formation portion by a second photoresist, the sixth step of etching the exposed palladium thin film, the seventh step of removing the second photoresist, the eighth step of curing the conductive resin, and the ninth step of applying a photosensitive polyimide resin to an entire surface of the substrate, forming a via-hole in the via formation portion, and thereafter curing the photosensitive polyimide resin.

DESCRIPTION OF THE PREFERRED EMBODIMENT

An embodiment of the present invention will be described hereinafter with reference to the accompanying drawings.

FIGS. 1A to 1L show the steps in manufacturing a multi-layered wiring substrate according to an embodiment of the present invention.

Figure 1A:
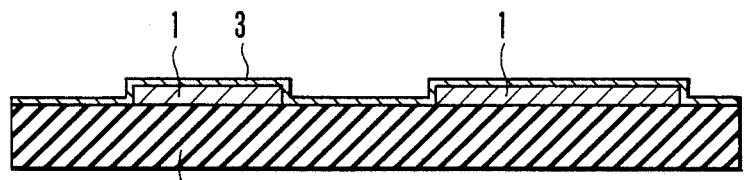
FIGS. 1A to 1L are sectional views for explaining the steps in manufacturing a multi-layered wiring substrate according to an embodiment of the present invention.
Figure 1B:
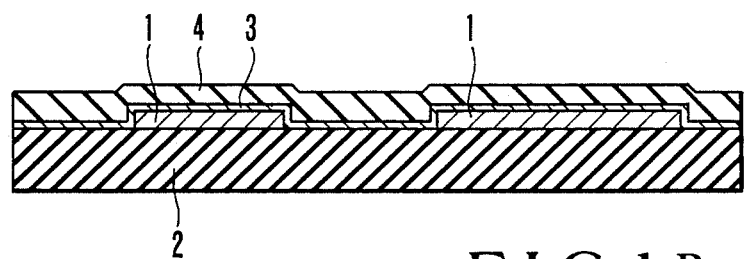
Figure 1C:
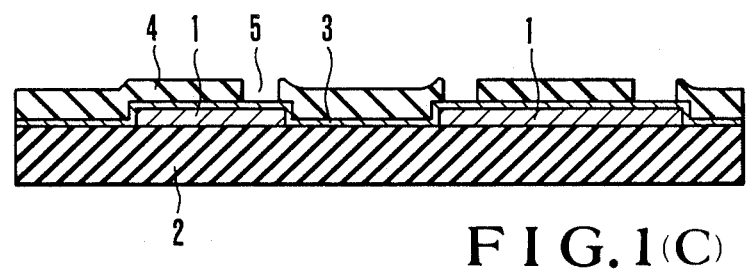
Figure 1D:
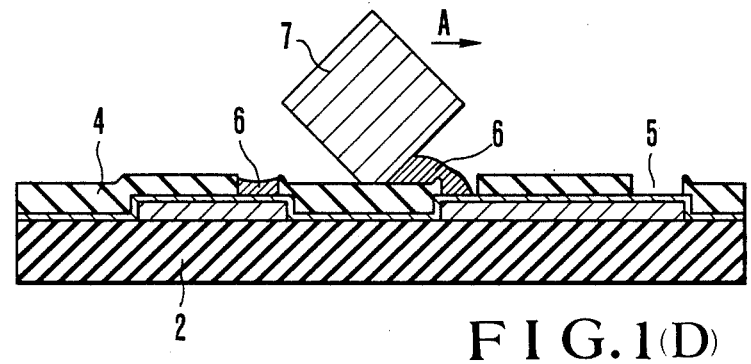
Figure 1E:
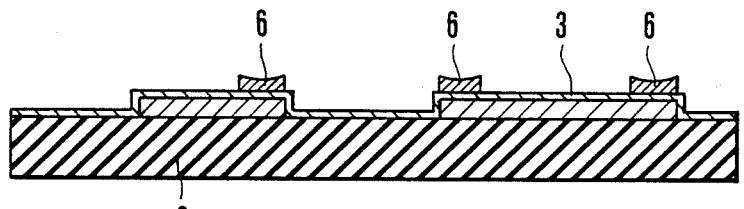
Figure 1F:
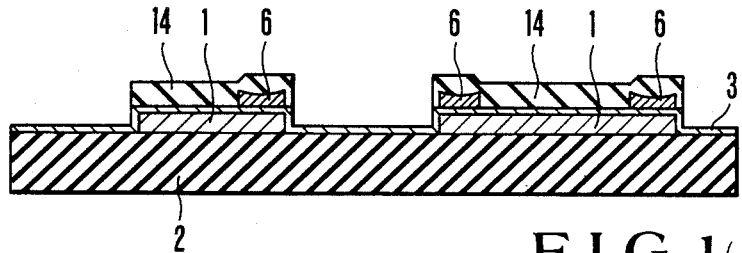
Figure 1G:
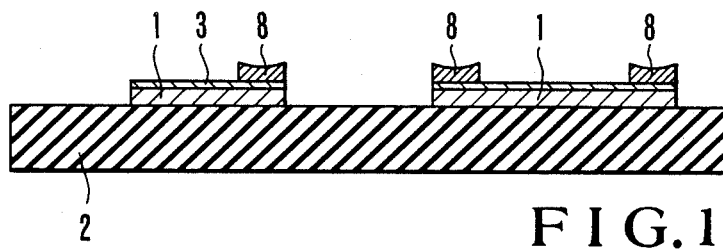
Figure 1H:
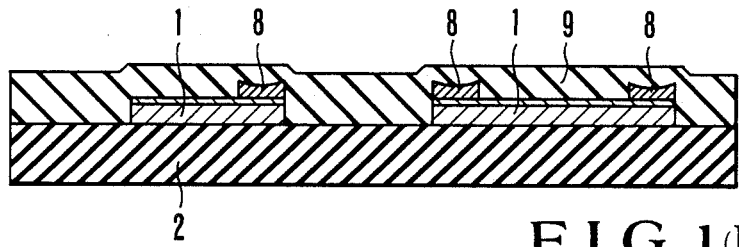
Figure 1I:
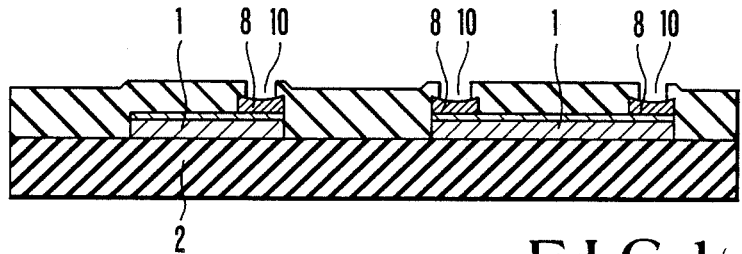
Figure 1J:
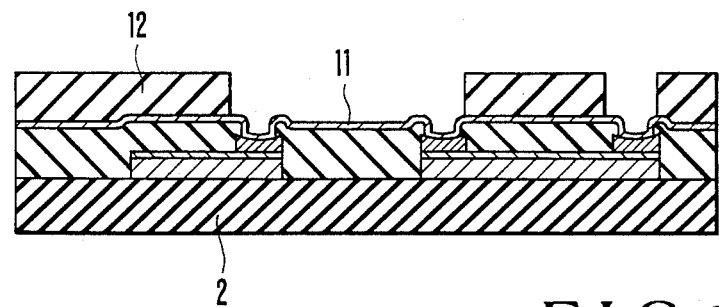

According to this embodiment, as shown in FIG. 1A, palladium is sputtered on an entire surface of a substrate 2 on which a conductor wiring layer 1 is formed, thereby forming a palladium thin film 3 having a thickness of 1,000 Å to 2,000 Å. The palladium thin film 3 is formed to realize easy formation of a photoresist pattern to be applied thereto, and to improve the adhesion strength between a conductive resin to be embedded later as a via filler and the conductor wiring layer, and the adhesion strength between polyimide and the conductor wiring layer. Then, as shown in FIG. 1B, a photoresist 4 is applied to the substrate 2 and is dried. The dried photoresist is exposed through a mask and developed, so that photoresist portions corresponding to predetermined via formation portions 5 are removed, as shown in FIG. 1C. Then, a polyimide-based conductive resin 6 is placed on the photoresist and is slid by a squeegee 7 (arrow A). As shown in FIG. 1D, the conductive resin 6 is embedded in the via formation portions 5. Then, the photoresist 4 is removed using an organic solvent such as methyl ethyl ketone. At this time, the polyimide-based conductive resin 6 remains because it is not dissolved by the above solvent, as shown in FIG. 1E. As shown in FIG. 1F, a photoresist 14 is applied again to the substrate 2, and is dried. The dried photoresist is exposed through a predetermined mask and developed to mask the conductor wiring layer 1. The palladium thin film 3 is then etched by ion-beam etching. Thereafter, the photoresist 14 is removed using an organic solvent such as methyl ethyl ketone, and the substrate 2 is placed in a curing furnace to cure the conductive resin 6. Therefore, vias 8 are formed, as shown in FIG. 1G. As shown in FIG. 1H, a photosensitive polyimide resin 9 is applied to the surface of the substrate 2, and is dried. At this time, since the vias 8 are formed on the substrate 2, the thickness of the photosensitive polyimide film 9 on the vias 8 is small. For this reason, the via-hole can be formed by exposure and development with high stability. FIG. 1I shows a state wherein after the exposure and development are performed through a mask to form via-holes 10, the substrate 2 is cured in the curing furnace. When the size of each via-hole 10 is slightly smaller than that of each via 8, a fine connection between the upper and lower conductor wiring layers can be achieved. When gold (Au) having high reliability is used for the conductor wiring layer 1, the wiring layer 1 is not adhered to the photosensitive polyimide film 9 thereon in this state. However, the palladium thin film is formed on the pattern as described above, so that the adhesion strength can be remarkably improved.

Figure 1K:
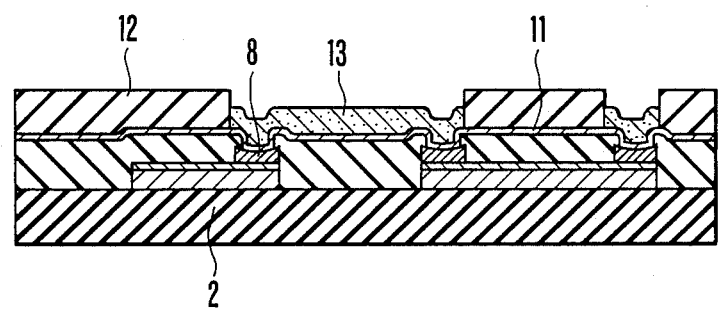
Figure 1L:
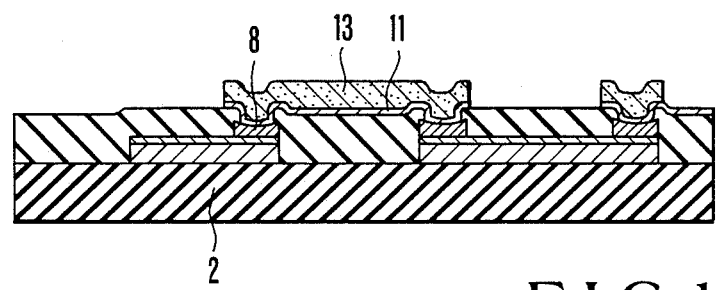

A metal thin film 11 is formed on the entire surface of the substrate 2, and a photoresist 12 is applied to the metal thin film 11 and is dried. This metal thin film is formed to have a thickness of 1,000 Å to 2,000 Å by combining titanium or chromium and palladium. Then, the photoresist 12 is exposed through a predetermined mask and developed, and a resist on the prospective upper conductor wiring layer formation portion is removed, thus obtaining a state shown in FIG. 1J. Then, the metal thin film 11 serves as a plating electrode to form an upper conductor wiring layer 13 by plating, as shown in FIG. 1K. At this time, since the vias 8 are formed in advance, disconnection of the upper conductor wiring layer 13 does not occur, thus achieving stable and fine connection. Thereafter, the photoresist 12 is removed by an organic solvent, and the metal thin film 11 is etched by ion beam etching, thus obtaining a state shown in FIG. 1L.

As described above, according to a method of manufacturing a multi-layered wiring substrate of the present invention, as the formation means of vias for connecting the upper and lower conductor wiring layers which sandwich the dielectric film, the vias are formed. The dielectric film is then formed and via-holes are provided, so that the via-holes each having a fine shape can be obtained with stability. Therefore, fine or reliable connection between the upper and lower conductor wiring layers can be effectively achieved.

What is claimed is:

1. A method of manufacturing a multi-layered wiring substrate, comprising:

the first step of forming a palladium thin film on an entire surface of a substrate including a conductor wiring layer;

the second step of masking a portion except for a predetermined via formation portion on said palladium thin film by a first photoresist;

the third step of embedding a polyimide-based conductive resin in said via formation portion through said first photoresist;

the fourth step of removing said first photoresist;

the fifth step of masking said conductor wiring layer and said via formation portion by a second photoresist;

the sixth step of etching said exposed palladium thin film;

the seventh step of removing said second photoresist;

the eighth step of curing said conductive resin; and the ninth step of applying a photosensitive polyimide resin to an entire surface of said substrate, forming a via-hole in said via formation portion, and thereafter curing the photosensitive polymide resin.

* * * * *